United States Patent
Yu et al.

(10) Patent No.: US 11,355,724 B2
(45) Date of Patent: Jun. 7, 2022

(54) ORGANIC LIGHT-EMITTING DIODE (OLED) DISPLAY DEVICES WITH UV-CURED FILLER

(71) Applicant: Applied Materials, Inc, Santa Clara, CA (US)

(72) Inventors: Gang Yu, Santa Barbara, CA (US); Chung-Chia Chen, New Taipei (TW); Wan-Yu Lin, Taipei (TW); Hyunsung Bang, Aschaffenburg (DE); Lisong Xu, San Jose, CA (US); Byung Sung Kwak, Portland, OR (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 155 days.

(21) Appl. No.: 16/685,944

(22) Filed: Nov. 15, 2019

(65) Prior Publication Data

US 2021/0135140 A1    May 6, 2021

Related U.S. Application Data

(60) Provisional application No. 62/931,760, filed on Nov. 6, 2019.

(51) Int. Cl.
*H01L 29/08*    (2006.01)
*H01L 51/50*    (2006.01)
(Continued)

(52) U.S. Cl.
CPC ........ *H01L 51/504* (2013.01); *H01L 51/0007* (2013.01); *H01L 51/0025* (2013.01);
(Continued)

(58) Field of Classification Search
CPC ............... H01L 51/504; H01L 51/0007; H01L 51/0025; H01L 51/426; H01L 51/5012;
(Continued)

(56) References Cited

U.S. PATENT DOCUMENTS 6,476,988 B1    11/2002 Yudasaka
8,227,269 B2    7/2012 Chen et al.
(Continued)

FOREIGN PATENT DOCUMENTS

JP    2001-196644    7/2001
KR    10-2010-0066416    6/2010
(Continued)

OTHER PUBLICATIONS

Zou, et al. "A Highly Hydrophilic and Biodegradable Novel Poly(annide-imide) for Biomedical Applications," Polymers 2016, 8:441.
(Continued)

*Primary Examiner* — Victor A Mandala
*Assistant Examiner* — Colleen E Snow
(74) *Attorney, Agent, or Firm* — Fish & Richardson P.C.

(57) ABSTRACT

An organic light-emitting diode (OLED) structure includes a stack of OLED layers; a light extraction layer (LEL) comprising a UV-cured ink; and a UV blocking layer between the LEL and the stack of OLED layers.

21 Claims, 5 Drawing Sheets

(51) Int. Cl.
  *H01L 51/52* (2006.01)
  *H01L 51/56* (2006.01)
  *H01L 51/00* (2006.01)
  *H01L 51/42* (2006.01)
(52) U.S. Cl.
  CPC ........ *H01L 51/426* (2013.01); *H01L 51/5012* (2013.01); *H01L 51/5271* (2013.01); *H01L 51/5275* (2013.01); *H01L 51/56* (2013.01)
(58) Field of Classification Search
  CPC .. H01L 51/5271; H01L 51/5275; H01L 51/56
  See application file for complete search history.

(56) References Cited

U.S. PATENT DOCUMENTS

| | | |
|---|---|---|
| 8,323,748 B2 | 12/2012 | Ling |
| 8,425,065 B2 | 4/2013 | Ravillisetty et al. |
| 9,099,575 B2 | 8/2015 | Medendorp, Jr. et al. |
| 9,111,464 B2 | 8/2015 | Bibi et al. |
| 9,224,978 B2 | 12/2015 | Jung et al. |
| 9,536,931 B2 | 1/2017 | Kim et al. |
| 2003/0222267 A1 | 12/2003 | Kim et al. |
| 2005/0258441 A1 | 11/2005 | Shitagami |
| 2007/0217019 A1 | 9/2007 | Huang et al. |
| 2010/0013741 A1 | 1/2010 | Watanabe |
| 2010/0045575 A1 | 2/2010 | Kim |
| 2010/0110551 A1 | 5/2010 | Lamansky et al. |
| 2010/0117106 A1 | 5/2010 | Trottier |
| 2010/0124603 A1 | 5/2010 | Ito et al. |
| 2010/0295077 A1 | 12/2010 | Melman |
| 2011/0086232 A1* | 4/2011 | Sharma ................ C03C 17/42 428/432 |
| 2012/0183690 A1* | 7/2012 | Titulaer ............ H01L 31/02366 427/256 |
| 2013/0116108 A1* | 5/2013 | Cassingham ............. C03C 1/02 501/54 |
| 2013/0140982 A1 | 6/2013 | Park |
| 2013/0181235 A1 | 7/2013 | Kang et al. |
| 2015/0123086 A1 | 5/2015 | Lee et al. |
| 2016/0268554 A1 | 9/2016 | Wu et al. |
| 2017/0077448 A1 | 3/2017 | Sakamoto et al. |
| 2017/0358779 A1 | 12/2017 | Wu et al. |
| 2018/0269414 A1 | 9/2018 | Bando |
| 2018/0358580 A1 | 12/2018 | Kim et al. |
| 2019/0058025 A1 | 2/2019 | Huang et al. |
| 2019/0103588 A1 | 4/2019 | Jiang et al. |
| 2019/0131567 A1 | 5/2019 | Li |
| 2019/0131568 A1 | 5/2019 | Li |
| 2019/0207155 A1* | 7/2019 | Lee ..................... H01L 51/5253 |

FOREIGN PATENT DOCUMENTS

| | | |
|---|---|---|
| KR | 10-2011-0061317 | 6/2011 |
| KR | 10-1319306 | 10/2013 |
| KR | 10-2015-0052490 | 5/2015 |
| KR | 10-1900954 | 9/2018 |

OTHER PUBLICATIONS

PCT International Search Report and Written Opinion in International Appln. No. PCT/US2020/058736, dated Feb. 26, 2021, 11 pages.

Office Action in Taiwanese Appln. No. 109138547, dated Sep. 11, 2021, 11 page (withEngish Search Report).

* cited by examiner

BPhen

BAlq

Alq

Tetracene

N,N'-diphenyl-N,N'-bis(3-methylphenyl)
(1,1'-biphenyl)-4,4'-diamine (TPD) (refractive index=1.7)

N,N'-bis(1-naphthyl)-N,N'-diphenyl-1,1'-biphenyl-4,4'-diamine (NPB)

N,N'-bis(1-phnathrene)-N,N'-diphenyl-1,1'-biphenyl-4,4'-diamine (PPD)

PPD is aslo known as: N,N'-Bis(phenanthren-9-y1)-N,N'-bis(phenyl)-benzidine,
PAPB, or as: N,N'-Di-[(9-phenanthrenyl)-N,N'-diphenyl]-1,1'-biphenyl-4,4'-diamine

ORGANIC LIGHT-EMITTING DIODE (OLED) DISPLAY DEVICES WITH UV-CURED FILLER

CROSS-REFERENCE TO RELATED APPLICATIONS

This application claims priority to U.S. Application Ser. No. 62/931,760, filed on Nov. 6, 2019, the disclosure of which is incorporated by reference.

TECHNICAL FIELD

The present disclosure relates to fabrication of organic light-emitting diode (OLED) display devices.

BACKGROUND

An organic light-emitting diode (OLED or Organic LED), also known as an organic EL (organic electroluminescent) diode, is a light-emitting diode (LED) in which the emissive electroluminescent layer is a film of organic compound that emits light in response to an electric current. This organic layer is situated between two electrodes; typically, at least one of these electrodes is transparent. OLEDs are used to create digital displays in devices such as television screens, computer monitors, portable systems such as smartwatches, smartphones, handheld game consoles, PDAs, and laptops.

An OLED display can be driven with a passive-matrix (PMOLED) or active-matrix (AMOLED) control schemes. In the PMOLED scheme, each row (and line) in the display is controlled sequentially, one by one, whereas AMOLED control uses a thin-film transistor backplane to directly access and switch each individual pixel on or off, allowing for faster response, higher resolution, and larger display sizes.

AMOLED displays are attractive for high pixel density, superior image quality, and thin form factor in comparison to conventional LCD displays. AMOLED displays are self-emissive devices that can be made with thin film process, on thin and flexible substrates, and do not require backlights as used in LCD displays. In addition to superior power efficiency over LCD devices, AMOLED devices are noted for features such as "Consuming-Power-only-when-Lighting-Up," and "Consuming-only-the-needed-Power-Corresponding-to-the-Emitting-Intensity". AMOLED displays have thus been viewed as an attractive display technology for battery powered portable products.

SUMMARY

In one aspect, some implementations provide an organic light-emitting diode (OLED) structure comprising: a stack of OLED layers; a light extraction layer (LEL) comprising a UV-cured ink; and a UV blocking layer between the LEL and the stack of OLED layers.

Implementations may include one or more of the following features. The LEL layer may have a thickness of up to 5 µm and the UV blocking layer may have a thickness of 50-500 nm. The UV blocking layer may comprise organic charge transport molecules. The UV blocking layer may comprise metal-oxide nano-particles. The metal oxide nano-particles may comprise one or more of $MoO_3$, $MnO_2$, $NiO$, $WO_3$, and $AlZnO$.

The OLED structure may further comprise a substrate, a dielectric layer on the substrate having an array of well structures, wherein each well structure includes oblique side walls and a floor, and the well structures are separated by plateaus, and the LEL at least partially fills the wells. The OLED structure may further comprise a mirror layer between the dielectric layer and the stack of OLED layers.

A top surface of the LEL may be substantially coplanar with a top surface of the plateaus. A top surface of the LEL may project above a top surface of the plateaus.

In another aspect, some implementations provide a method for manufacturing an organic light-emitting diode (OLED) structure, the method comprising: depositing a UV blocking layer over a stack of OLED layers; depositing a layer of UV-curable fluid over the UV blocking layer; and curing the layer of UV-curable fluid with UV light to form a light extraction layer (LEL) over the UV blocking layer.

Depositing the layer of UV-curable fluid may comprise ejecting droplets of the UV-curable fluid from a nozzle. The droplets may be ejected to at least partially fill a plurality of wells. Depositing the layer of UV-curable fluid may comprise successively forming a plurality of sublayers in each well. Forming a sublayer of the plurality of sublayers may comprise ejecting one or more droplets of the UV-curable fluid into the well and curing the fluid before forming a subsequent sublayer. Forming the sublayer in the well may comprise depositing a single droplet of the UV-curable fluid into the well. Forming the sublayer may comprise depositing multiple single droplets of the UV-curable fluid into the well. The light extraction layer (LEL) may have a thickness of up to 5 µm and the UV blocking layer may have a thickness of 50-500 nm.

Advantages may include, but are not limited to, one or more of the following.

One or more layers in an LED device, e.g., a light extraction layer (LEL), may be fabricated using UV-curable inks. This permits the use of droplet ejection techniques that use UV-curing to deposit the layer(s), which in turn can permit manufacturing at higher throughput and/or lower cost.

The details of one or more aspects of the subject matter described in this specification are set forth in the accompanying drawings and the description below. Other features, aspects, and advantages will become apparent from the description, the drawings, and the claims.

BRIEF DESCRIPTION OF THE DRAWINGS

Like reference symbols in the various drawings indicate like elements.

DETAILED DESCRIPTION

An OLED is a two-terminal thin film device with a stack of organic layers including a light emitting organic layer sandwiched between two electrodes. At least one of the electrodes is transparent, thus allowing the emitted light to pass through. Typically, an encapsulation or passivation covers the OLED stack. Due to mismatch of optic parameters in the OLED stack and the encapsulation or passivation layer thereon, significant efficiency loss can occur. In addition, in a conventional device configuration with a stack of planar layers, significant light can be absorbed by the support substrate or escape at low angles.

An internal quantum efficiency (IQE) quantifies the ratio of the number of converted photons and the number of input electrons whereas the external quantum efficiency (EQE) indicates the ratio of number of emitted and extracted photons that have been converted from the number of input electrons. In this context, even though IQE can be almost perfect, EQE can be far from ideal because significant amount of emitting light can be trapped inside the OLED display or waveguided along horizontal direction (in parallel to the substrate). In one example, even with ideal IQE (e.g., about 100% for phosphorescent materials), an EQE of about 20 to 25% has been realized in commercial OLED with conventional device configurations. In addition to optical energy loss to output emission, the light trapped inside can also be waveguided to neighbor pixels and can be scattered into front view, causing "light leakage" or "optical cross-talk", and reducing display sharpness and contrast.

Figure 1A:
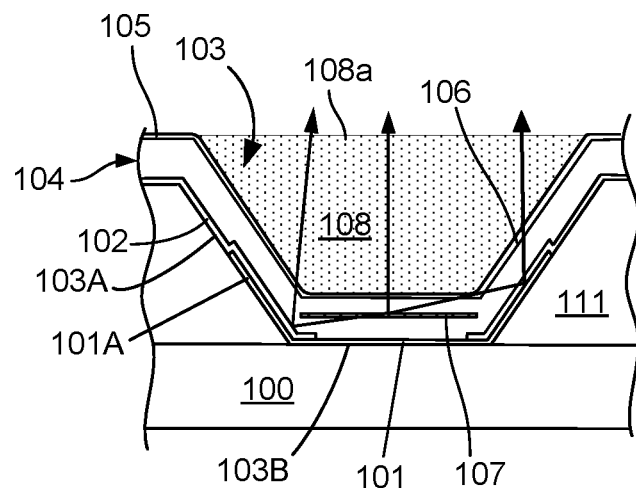
FIGS. 1A to 1B show examples of schematic cross-sectional views of a top emission OLED pixel with a patterned/structured light extraction layer of index matching material.
Figure 1B:
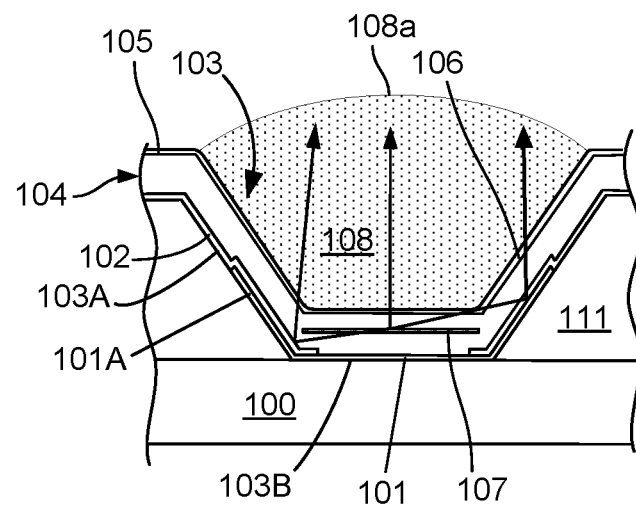
Figure 1C:
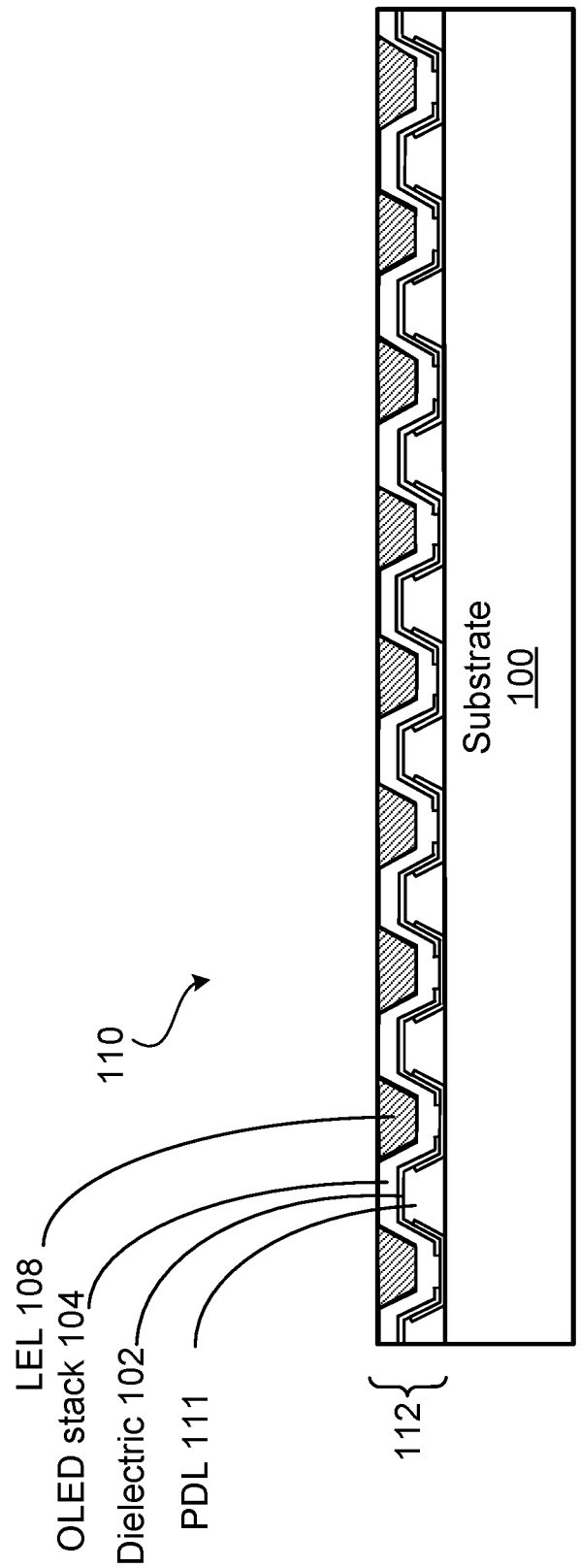
FIG. 1C shows an example of a schematic cross-sectional view of an array of top emission OLED pixels with the patterned/structured light extraction layer of index matching material.

Referring to FIGS. 1A to 1C, one solution to this problem is to form the OLED stack in a well structure 103, with mirrors along the bottom 103B and portions of the oblique sidewalls 103A of the well and a patterned light extraction layer 108 filling the well. Examples of a top-emitting OLED structure are shown in FIGS. 1A and 1B. The OLED structure is formed on a support substrate 100, which optionally can be removed following the fabrication process.

The well can be provided by a recess in a dielectric pixel defining layer (PDL) 111 that is disposed over the support substrate 100. The pixel defining layer (PDL) 111 can be formed after a pixel driving circuit made with one or more thin film transistors (TFTs) is formed on the substrate 100. The PDL 111 can be a polymeric material, e.g., can be formed by depositing a layer of photoresist material. The layer of polymeric material is then selectively patterned to form recesses that will provide the wells. The top surface PDL provides a plateau that separates the individual OLED subpixels within the devices.

A conductive anode 101 is formed at the bottom 103B of or below the well structure 103. The anode 101 can extend up a portion of the oblique side walls 103A of the well. The anode 101 can be silver and/or another reflective conductive material, or can be from a conductive non-reflective material that is coated with a conductive optically reflective material. In some implementations, the anode 101 is sufficiently reflective to serve as a mirror.

The anode 101 can be processed before the PDL 111 and formed after a thin film transistor (TFT) is formed on substrate 100. For example, the thin film transistor can include conductive terminals for the gate, drain and source regions of the transistor. Here, the anode 101 can be disposed over the TFT and arranged in electrical contact with the drain of the TFT by, for example, conductive vias through a dielectric layer.

As illustrated in FIGS. 1A and 1B, the anode 101 can be formed after the pixel defining layer (PDL) 111 is deposited and patterned. A portion of the anode 101 can extend partially or fully up the oblique sidewalls 103A into the region of the PDL slope, for example, e.g., in area 101A. Thus, the anode 101 is spaced from the top of the recess (i.e., the top of the plateau). As a result, the mirror provided by the anode 101 can extend partially or fully up the oblique sidewalls 103A.

Alternatively, the anode 101 can be deposited before the PDL 111. A portion of the anode 101 can extend below the pixel defining layer (PDL) 111. For example, the anode 202 can be deposited only in the area of the flat bottom region 103B. In this case, a separate mirror layer can be formed that covers the bottom 103B of the well and extends partially or fully up the oblique sidewalls 103A.

Assuming the anode 101 is formed over the PDL 111, a transparent dielectric layer 102 can be formed over a portion of the anode 101 and over exposed portions of the PDL 111. The aperture in the dielectric layer 102 will define an emission area for the OLED. The dielectric layer 102 can be formed using photoresist type of material. As illustrated, the dielectric layer 102 can cover the anode 101 at the outer edge of the bottom 103B of the well and on the oblique sidewalls 103A. But otherwise, extension of the dielectric layer 102 into the bottom 103B of the well is generally minimized.

An OLED layer stack 104 that includes a light emission zone 107 is formed over the anode 101. The OLED layer stack 104, for example, in a top emitting OLED stack, can include an electron injection layer (EIL), an electron transport layer, a hole blocking layer, a light emissive layer (EML), an electron blocking layer (EBL), a hole transport layer (HTL), and a hole injection layer (HIL), although this is just one possible set of layers. The lowest layer of the OLED stack 104 is in electrical contact with the anode 101, either directly or through a conductive mirror layer disposed on the anode. The portion of the light emissive layer (EML) above the region of the anode 101 exposed through the aperture in the dielectric layer 102 can provide the light emission zone 107.

Another transparent electrode 106, e.g., the cathode, can be formed over the OLED stack 104. The top layer of the OLED stack 104 is in electrical contact with the cathode 106. The transparent electrode 106 is below the A capping layer (CPL) can be placed on top of the cathode 106. CPLs are typically organic materials similar to non-EML OLED layers. A passivation layer can be deposited on the CPL layer.

The electrode 106 can be a continuous layer covering the entire display and connecting to all pixels. In comparison, the anode 101 is not made continuous so that independent control of each OLED can be achieved. This permits sub-pixel control; each pixel can include three subpixels of different colors, e.g., R, G, and B.

In implementations in which the anode 101 serves as sidewall mirrors (e.g., deposited along the slopes of the PDL), the emission area can be further controlled by placing the dielectric layer 102 over such sidewall mirrors. The extent of the dielectric layer 102 can be varied. In general, OLED emission is highly dependent on layer thicknesses. The dielectric layer 102 allows suppression of emission from the OLED structure formed on the sidewalls (during device fabrication) where the thickness differences between sidewall and bottom of the well can result in inconsistent emission characteristics, including emission spectra and color coordinates.

The OLED structure further has an index-matching filling material 108 disposed inside the concave area of well structure 103. The top surface 108a of the index-matching filling material/layer can be flat (see FIG. 1A) or curved/non-planar (see FIG. 1B). Through a proper device design, by introducing the mirror around the OLED emission zone and the light extraction layer (through index-matching material in the concavity), EQE can be improved by a factor of 2-3 from the conventional OLED design. As a result, the power consumption of an OLED display in portable applications can be reduced by a commensurate factor of 2 to 3, which allows using a smaller, lighter weight rechargeable battery and achieves faster charging time than that used in the current mobile devices such as touch-screen phones, pads, and laptops. In a similar vein, the same mobile device with high efficient OLED display can run a much longer time (for example, slightly less than a factor of 2-3) on a single charge of the original battery. Another benefit of such highly efficient pixel architecture is longer lifetime of the devices as the pixels will achieve desired brightness with lower current and voltage, which leads to lower degradation phenomena. Yet another benefit is the technical feasibility of achieving higher pixel density as the higher EQE enables smaller emitting area to achieve the same brightness as before.

However, the newly added light extraction layer (LEL) may not be manufacturable at a commercially viable price using conventional techniques. This added layer calls for additional processes and corresponding tools. In particular, it would be desirable to deposit the filler layer using droplet ejection techniques, e.g., a 3D printing techniques using droplet ejection. The liquid material to be ejected as droplets is often called an "ink", although it need not (and typically would not) include pigmentation.

One type of filling "ink" promising for the LEL is a solution including organo-metallic molecules or metal-oxide nano-particles with or without surface passivated with organic linking units (named "MO ink" in more detail below). This type of filling ink has high solid loading (e.g., high percentage ratio of forming solid/ink volume which may be in slurry mixture) and tunable dielectric constant to potentially maximize the output emission. The curing method involves exposing the filling inks to UV radiation along with a duration of post annealing time at an elevated temperature. Unfortunately, UV exposure dose required for curing of the LEL precursor material can be harmful to the OLED structure underneath.

To address the manufacturing challenge caused by the UV-curing ink for the index matching material of the light extracting layer (LEL), the present disclosure proposes solutions that introduces a UV-blocking layer underneath the LEL layer so that UV-curable inks can be adopted for the patterned LEL layer without compromising the performance of the OLED stack underneath. Both organic and inorganic materials can be used for the UV-blocking layer.

In addition, an appropriate surface profile or a hydrophobic surface can be provided that enables mis-aligned ink droplets during manufacturing to fall back into the well by means of gravity and the surface property of the top of the dome (as discussed in further detail in FIG. 4B below). These techniques can be used in conjunction with or independent of the UV-blocking layer deposited over the OLED stack (as discussed in further detail in FIG. 2 below).

Moreover, with the inkjet process of the present disclosure, a patterned LEL layer can be formed with a gradient in the index of refraction. The inkjet printing or slot-die coating with multiple coating steps enables the patterned LEL with gradient index and with integration with the covering glass (or touch panel in on-cell touch configuration).

FIG. 1C shows the cross-sectional view of an array 110 of OLED pixels arranged in a layered structure 112 on substrate 100.

Figure 2:
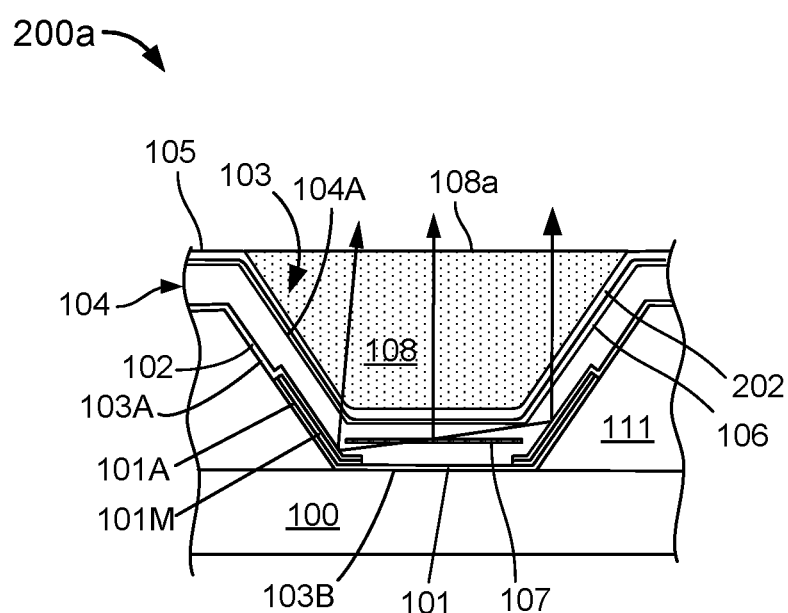
FIG. 2 shows an example of a schematic cross-sectional view of a top emission OLED pixel with an UV-Blocking layer underneath the patterned/structured light extraction layer.
Figure 3D:
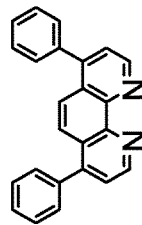
FIGS. 3A-3G show examples of organic materials suitable for the UV-blocking layer.
Figure 3E:
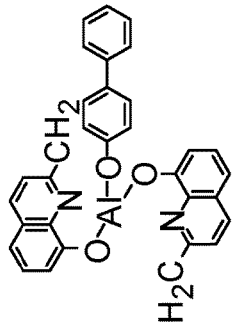
Figure 3F:
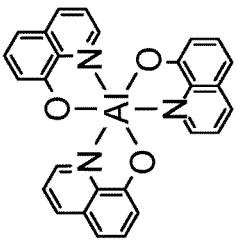
Figure 3G:
Figure 3A:
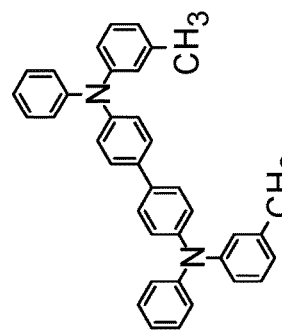
Figure 3B:
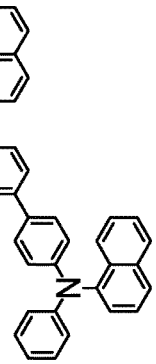
Figure 3C:
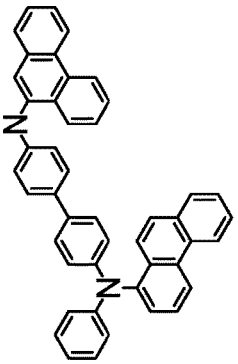

Further referring to FIG. 2, a cross-section view of an OLED structure 200A illustrates an UV-blocking layer 202 between the top-surface 104A of the OLED layer 104 and the patterned LEL layer 108. Except as discussed below, the OLED structure 200A can be similar to the OLED structure 100A and 100B discussed with reference to FIGS. 1A and 1B. The OLED structure 200A is formed on a substrate 100 and includes an array of well structures 103, each including the bottom region 103B and sidewall region 103A. The well structures 103 are separated by the plateau 105. As discussed above, the dielectric layer 102 is formed on the slopes of the PDL 111 and extends to the edge area of the bottom region 103B, although extension into the recess bottom region is possible but generally minimized.

The anode 101 is formed in the bottom region 103B and can extend partially up the sidewalls 103A. As noted above, the anode 101 can be reflective, or can be a conductive non-reflective material that is coated with a conductive optically reflective material.

In more detail, the floor of each well structure 103 is a bottom flat surface above substrate 100, which represents the flat top metal surface formed during thin film transistor (TFT) circuit process (such as the metal layer used for source and drain electrode of a thin film transistor TFT). A mirror layer 101M can be formed over anode 101. The mirror layer 101M may use silver (Ag) or other reflective metal. Alternatively, the anode can be a transparent conductive material deposited over a conductive or non-conductive reflective layer. For example, the anode 101 can be a conductive indium tin oxide (ITO) deposited on top of the reflective mirror layer 101M. For an anode of an OLED, internal total reflection is desired.

In some implementations, the anode is limited to the bottom region 103B. In some implementations, the anode also extends partially or fully up the sloped sidewalls 103A of the recess. In some implementations, the mirror layer 101M is a conductive reflective metal that extends onto the sloped sidewalls 103A of the recess. This conductive reflective metal, which is formed on top of the initial anode, can lead to a potential new anode on the bottom/floor region of the pixel. As discussed above, a transparent dielectric layer 102 can be deposited and patterned to eliminate electrical excitation and light emission from the sidewall region 103A.

The cathode 106 can be a continuous layer that is unpatterned and transparent. In a top emitting configuration, the light extraction layer (LEL) 108 is on top of the UV-blocking layer 202, which, in turn, is on top of the cathode 106. In this configuration, a passivation layer can be deposited on the capping layer (CPL) layer which is right above the cathode 106.

As illustrated in, for example, FIGS. 1A to 1C, the LEL layer 108 is disposed over the OLED stack 104 and top cathode 106. The LEL layer 108 at least partially fills each well. In some implementations, the LEL layer 108A "overfills" the well so as to form a convex top surface 109 that projects above the top surface of the plateaus 105.

Between the top surface 104A the OLED layer stack 104 and the patterned LEL 108 is a UV-blocking layer 202. The UV-blocking layer 202 can be formed with a similar process used for forming an OLED layer (such as physical vapor deposition), or by a different process (such as chemical vapor deposition). The UV blocking layer 202 can also be formed by a coating method, e.g., spin-coating. The UV blocking layer 202 has strong absorption at the UV wavelength used for processing the LEL layer 108/108a (e.g., at least 90% to 100% absorption). The UV-blocking layer 202 can be relatively thin, e.g., 50 to 500 nm thick. Examples of materials for the UV blocking layer 202 can be found below. The desired process for depositing the UV blocking layer may depend on the material chosen. In general, an evaporative process can be advantageous because sputtering or chemical vapor deposition (CVD) may lead to additional device damaging elements (for example, plasma in sputtering, contaminants and possibly plasma in CVD/PECVD).

Although a passivation layer can be deposited on the CPL layer, in some implementations the UV blocking layer also functions as the passivation layer and a separate passivation layer on the CPL layer is not required. In this case, the UV blocking layer can function as permeation blocking layer for the potential wet LEL deposition, like ink jet printing (IJP).

Both organic and inorganic materials can be used for the UV-blocking layer. Example of organic materials that can be used for UV-blocking layer include: N,N'-Bis(3-methylphenyl)-N,N'-diphenylbenzidine, TPD (3.18 eV); N,N'-Di(1-naphthyl)-N,N'-diphenyl-(1,1'-biphenyl)-4,4'-diamine, NPB (3.0 eV); N,N'-Bis(phenanthren-9-yl)-N,N'-bis(phenyl)-benzidine, PAPB (or PPD); 4,7-Diphenyl-1,10-phenanthroline, BPhen (3.0 eV); Bis(8-hydroxy-2-methylquinoline)-(4-phenylphenoxy)aluminum, BAlq (3.0 eV), Tris-(8-hydroxyquinoline)aluminum, Alq (2.8 eV); Tetracene, C8H12 (3.0 eV); 4-phenyl, 4P (3.1 eV); 6-phenyl, 6P (3.1 eV), and the like (number in the bracket representing absorption edge). The molecular structures of these structures are shown in FIG. 3.

This type of organic materials is often known as charge transport molecules (either hole transport or electron transport) in the field of organic thin film devices such as organic light emitting diodes. The energy gap can be tuned to desired wavelength by molecular structure engineering while maintain the processability (for example, by thermal deposition) of the material. Example includes TPD, NPB, and PAPB (or PPD). By replacing -methylphenyl group with -naphthyl group or -phnathrene group, the onset of the absorption band can be effectively tuned. In addition to tuning the phenyl group, bandgap engineering can also be achieved by replacing the —H atom on benzene ring with —OH or —CN group. Another characteristic of this type of organic materials is the high absorption coefficients. For example, absorption coefficients over $10^5$ cm$^{-1}$ are often seen in this type of molecules due to its direct type of energy gap between UV absorption bands. At this absorption level, UV radiation intensity can be attenuated by 10 times with a UV-blocking layer of 100 nm thickness and by 100 times with a UV-blocking film of 200 nm in thickness. These materials are thus excellent candidates for the UV-blocking layer (202) underneath the LEL (105/105a). When selecting the composition with multiple sub-groups comprising different number of phenyl rings (for example, NPB), broad-absorption can be achieved over entire UV radiation from a Hg lamp (from UV-I to UV-III bands). Since the organic material used for the UV blocking layer can also be used for the charge transport layer in the OLED stack, the same deposition tool can be used.

The UV blocking layer can also be formed with another type of organic molecules known as engineering polymers. Examples include, but are not limited, polystyrenes, polycarbonates, PMMA and their derivatives. This type of engineering polymers have absorption edge close to 3.1 eV and block UV light effectively.

Examples of inorganic material suitable for the UV-blocking layer 202 include $MoO_3$, $MnO_2$, NiO, $WO_3$, AlZnO, and alloy oxides comprising these materials. These films can be fabricated with thermal or other type of physical deposition method without damaging the OLED device underneath.

Combination of the materials as discussed above in multiple layer stack or in blend form can also be used for the UV-absorption layer 202. The thickness of the UV-blocking layer can be chosen in range of 50-500 nm, depending on the absorption coefficient of the UV-blocking layer and the attenuation level for the UV-dose needed for the LEL ink curing.

Metal-oxide and/or organometallic compound based LEL layer 105/105a can be formed with inks with corresponding organometallic precursors, examples of such inks include ZrO, ZrOC, AlO, AlOC, TiO, TiOC, ZnO, ZnOC, and the combination in blend form (denoted as MO/MOC inks in the following text). Such compounds are characterized with refractive index higher than that of the organic layers in OLED stack. Keeping certain amount of carbon atoms in the forming LEL (i.e., the metal-OC compounds above) may achieve the index matching between the LEL and OLED stack. As a reference point, metal oxide such as ZrO or TiO2 can have refraction index substantially higher than a target value (for example, n=1.82). With the amount of carbon (C), the n can be tuned within a range from approximately 2.2 down to approximately 1.8.

The solid loading of the metal-oxide nano-particles are typically in range of 20-80% (e.g., percentage ratio of forming solid/ink volume). Alcohols such as isopropanol alcohol (IPA) and glycol ethers such as propylene glycol methyl ether acetate (PGMEA) can be used as the solvents for this type of MO/MOC inks. To reduce the damage to the OLED underneath, $H_2O$ molecules can be removed from the solvent during the ink preparation. Printing the ink under low humidity (such as under dry air, N2 or Ar) or with a moderate substrate temperature in 40-60° C. range may also be used to minimize performance reduction of the OLED underneath. In one illustration, using a 1-10 pl nozzle head, a drop volume may be achieved for the emitting pixels for portable display products (~25 um×25 um×2 um~$10^{-15}$ m$^3$~$10^{-12}$ l=1 pl). Larger nozzle head can be used for desk-top and wall-hanging displays with larger pixel pitches. The desirable solid content can be achieved with smaller nozzle head with multiple ink drops at each stop, or with a large nozzle head with single drop for each well. Nozzle array is often used to improve the throughput to achieve ~1 minute/substrate tact time for mass-production.

For example, an LEL forming process over the UV-blocking layer includes a printing process, a solvent removal and pre-dry process under a moderate temperature (50-100° C.) for a brief time (a few minutes). Pre-baking in a chamber under controlled environment and with reduced pressure can reduce the process time. The dried LEL array can then undergo an UV exposure for crosslink with dose in ~0.1-10 J/cm$^2$. A final setting process is carried out at elevated temperature (for example, in 70-130° C. for 5-30 minutes).

Figure 4:
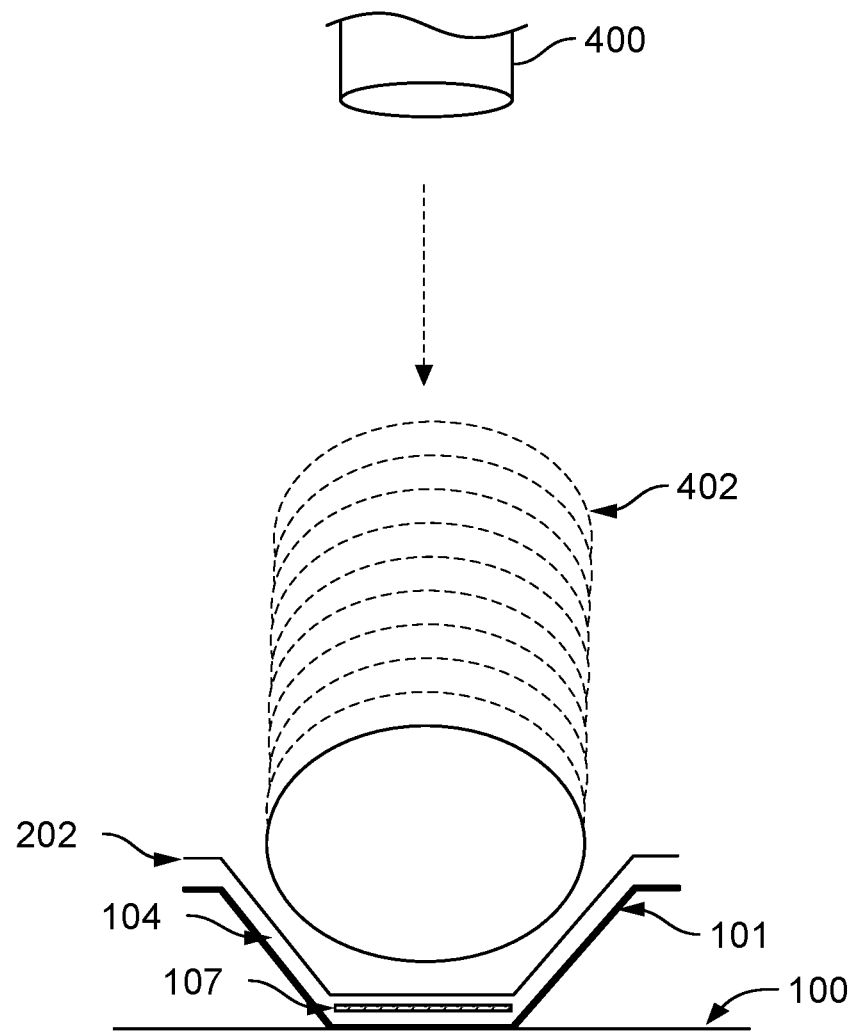
FIG. 4 illustrates of filling an OLED structures with a UV-curable ink droplet.

Referring to FIG. 4, in a 3D printing process, the LEL layer 108 can be formed by successively depositing and curing multiple sublayers, with the stack of sublayers providing the LEL layer 108. A sublayer can correspond to a single scan of a printhead 400 and curing of the ejected droplets 402 from the printhead. In some implementations, for each well, a sublayer of the LEL can be formed with multiple drops of the ink. Alternatively, each sublayer within the LEL layer 108 for a given well can be formed with a single drop per sublayer; due to surface tension the drop can spread out to cover the width of the well. In some implementations, the well is filled with the liquid precursor for the LEL and the entire well is cured at once, rather than sublayer by sublayer.

With inkjet process of the present disclosure, a patterned LEL layer can be formed with a gradient from top to bottom in the index of refraction. In particular, the inkjet printing or slot-die coating with multiple coating steps enables the patterned LEL with gradient index and with integration with the covering glass (or touch panel in on-cell touch configuration). The drops in the consecutive scans can use inks with a consecutively lower refraction index than the previous scan (by increasing the C/O ratio, or by changing MO composition with multiple metals with different refraction index). The wetting effect of the dropping ink on the receiving MO/MOC film can be used for further tuning the gradient profile. Eventually a patterned LEL array can be formed with the refraction index matching to that of the OLED stack (with refraction index of ~1.75-1.82), and the index of the LEL top surface with an index matching to a protection glass (such as, for example, the Gorilla glass, a Corning brand, used in many mobile phones with refraction index ~1.52). For example, the cross-section profile of the gradient index can be controlled by ink properties, and by the detail printing conditions. Thus, with a dedicated design, the desired view angle dependencies can be achieved for different applications. For example, larger view angle is preferred for monitors and wall-hanging large size TVs. Narrow view angle is preferred for entertaining displays in commercial airplanes. Moderate view angle with strong emission intensity in front view direction is preferred for palm size mobile phones of which the optimized front view performance allows longer operation time per battery charging.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An organic light-emitting diode (OLED) structure comprising:
    a stack of OLED layers;
    a light extraction layer (LEL) comprising a UV-cured ink; and
    a UV blocking layer between the LEL and the stack of OLED layers, the UV blocking layer having at least 90% absorption to UV light of wavelengths for curing the UV-cured ink and having a thickness of 50-500 nm.

2. The structure of claim 1, wherein the LEL layer has a thickness of up to 5 µm.

3. The structure of claim 1, wherein the UV blocking layer comprises metal-oxide nano-particles.

4. The structure of claim 1, further comprising a substrate, a dielectric layer on the substrate having an array of well structures, wherein each well structure includes oblique side walls and a floor, and the well structures are separated by plateaus, and the LEL at least partially fills the well structures.

5. The structure of claim 4, further comprising a mirror layer between the dielectric layer and the stack of OLED layers.

6. The structure of claim 4, wherein a top surface of the LEL is substantially coplanar with a top surface of the plateaus.

7. The structure of claim 4, wherein a top surface of the LEL projects above a top surface of the plateaus.

8. The structure of claim 1, wherein wherein material of the UV blocking layer has an absorption coefficient to UV light over $10^5$/cm.

9. An organic light-emitting diode (OLED) structure comprising:
    a stack of OLED layers;
    a light extraction layer (LEL) comprising a UV-cured ink; and
    a UV blocking layer between the LEL and the stack of OLED layers, wherein the UV blocking layer comprises organic charge transport molecules.

10. An organic light-emitting diode (OLED) structure comprising:
    a stack of OLED layers;
    a light extraction layer (LEL) comprising a UV-cured ink; and
    a UV blocking layer between the LEL and the stack of OLED layers, wherein the UV blocking layer comprises metal-oxide nano-particles, wherein the metal oxide nano-particles comprise one or more of $MoO_3$, $MnO_2$, $NiO$, $WO_3$, and $AlZnO$.

11. A method for manufacturing an organic light-emitting diode (OLED) structure, the method comprising:
    depositing a UV blocking layer over a stack of OLED layers, the UV blocking layer having at least 90% absorption to UV light within a first wavelength band and having a thickness of 50-500 nm;
    depositing a layer of UV-curable fluid over the UV blocking layer; and
    curing the layer of UV-curable fluid with UV light of the first wavelength band to form a light extraction layer (LEL) over the UV blocking layer.

12. The method of claim 11, wherein depositing the layer of UV-curable fluid comprises ejecting droplets of the UV-curable fluid from a nozzle.

13. The method of claim 12, wherein the droplets are ejected to at least partially fill a plurality of wells.

14. The method of claim 13, wherein depositing the layer of UV-curable fluid comprises successively forming a plurality of sublayers in each well.

15. The method of claim 14, wherein forming a sublayer of the plurality of sublayers comprises ejecting one or more droplets of the UV-curable fluid into the well and curing the fluid before forming a subsequent sublayer.

16. The method of claim 15, wherein forming the sublayer in the well comprises depositing a single droplet of the UV-curable fluid into the well.

17. The method of claim 15, wherein forming the sublayer comprises depositing multiple single droplets of the UV-curable fluid into the well.

18. The method of claim 12, wherein the light extraction layer (LEL) has a thickness of up to 5 µm and the UV blocking layer has a thickness of 50-500 nm.

19. An organic light-emitting diode (OLED) display, comprising:

a substrate having a driving circuitry;

a dielectric pixel defining layer disposed on the substrate, the pixel defining layer having a plurality of wells formed therein; and a plurality of OLEDs formed in the plurality of wells, each OLED of the plurality of OLEDs formed in a corresponding well of the plurality of wells and including an anode formed at a bottom of the well, a stack of OLED layers disposed on the anode, a cathode disposed on the stack of OLED layers, a UV blocking layer disposed on the cathode, and a light extraction layer (LEL) comprising a UV-cured ink disposed over the UV blocking layer to at least partially fill the well, wherein the UV blocking layer has at least 90% absorption to UV light of wavelengths for curing the UV-cured ink and having a thickness of 50-500 nm.

20. The display of claim 19, wherein the stack of OLED layers and the cathode span the plurality of OLEDs.

21. The display of claim 19, wherein the UV blocking layer one or more of comprises organic charge transport molecules or metal-oxide nano-particles.

* * * * *